(12) United States Patent
Yu et al.

(10) Patent No.: US 10,867,960 B2
(45) Date of Patent: *Dec. 15, 2020

(54) DEVICE PACKAGE INCLUDING MOLDING COMPOUND HAVING NON-PLANAR TOP SURFACE AROUND A DIE AND METHOD OF FORMING SAME

(71) Applicant: Taiwan Semiconductor Manufacturing Company, Ltd., Hsinchu (TW)

(72) Inventors: Chen-Hua Yu, Hsinchu (TW); Meng-Tse Chen, Changzhi Township (TW); Ming-Da Cheng, Taoyuan (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/659,145

(22) Filed: Oct. 21, 2019

(65) Prior Publication Data

US 2020/0051951 A1 Feb. 13, 2020

Related U.S. Application Data

(60) Continuation of application No. 15/717,300, filed on Sep. 27, 2017, now Pat. No. 10,468,377, which is a
(Continued)

(51) Int. Cl.
*H01L 21/56* (2006.01)
*H01L 23/00* (2006.01)
(Continued)

(52) U.S. Cl.
CPC ............ *H01L 24/96* (2013.01); *H01L 21/561* (2013.01); *H01L 23/3128* (2013.01);
(Continued)

(58) Field of Classification Search
CPC ......... H01L 24/05; H01L 24/06; H01L 24/96; H01L 23/3128; H01L 2224/06102;
(Continued)

(56) References Cited

U.S. PATENT DOCUMENTS 6,555,906 B2  4/2003  Towle et al.
7,619,901 B2  11/2009  Eichelberger et al.
(Continued)

FOREIGN PATENT DOCUMENTS

JP  2001521288 A  11/2001
KR  1020080094251 A  10/2008
KR  20140035804 A  3/2014

*Primary Examiner* — Khiem D Nguyen
(74) *Attorney, Agent, or Firm* — Slater Matsil, LLP

(57) ABSTRACT

A device package includes a die and a molding compound around the die. The molding compound has a non-planar surface recessed from a top surface of the die. The device package also includes an interconnect structure over the die. The interconnect structure includes a redistribution layer extending onto the molding compound and conformal to the non-planar surface of the molding compound. The device package further includes a first connector disposed over the die and bonded to the interconnect structure.

20 Claims, 17 Drawing Sheets

Related U.S. Application Data division of application No. 14/555,338, filed on Nov. 26, 2014, now Pat. No. 9,786,631.

(51) Int. Cl.
*H01L 23/538* (2006.01)
*H01L 23/31* (2006.01)

(52) U.S. Cl.
CPC .......... *H01L 23/5389* (2013.01); *H01L 24/03* (2013.01); *H01L 24/05* (2013.01); *H01L 24/06* (2013.01); *H01L 21/568* (2013.01); *H01L 24/11* (2013.01); *H01L 24/13* (2013.01); *H01L 2224/02379* (2013.01); *H01L 2224/0401* (2013.01); *H01L 2224/04105* (2013.01); *H01L 2224/05548* (2013.01); *H01L 2224/05647* (2013.01); *H01L 2224/06102* (2013.01); *H01L 2224/10126* (2013.01); *H01L 2224/11334* (2013.01); *H01L 2224/12105* (2013.01); *H01L 2224/13022* (2013.01); *H01L 2224/13024* (2013.01); *H01L 2924/1815* (2013.01); *H01L 2924/18162* (2013.01); *H01L 2924/3511* (2013.01)

(58) Field of Classification Search
CPC .......... H01L 2224/05548; H01L 24/13; H01L 24/16; H01L 24/48; H01L 24/81; H01L 2924/181; H01L 2924/15311; H01L 2924/15331; H01L 2224/04105; H01L 2224/73204; H01L 2224/81; H01L 2224/16227; H01L 2224/73253; H01L 2224/04042; H01L 2224/16235; H01L 2225/1058; H01L 2225/06513; H01L 2225/06517; H01L 21/561; H01L 21/568; H01L 21/6835; H01L 24/03; H01L 24/11
See application file for complete search history.

(56) References Cited

U.S. PATENT DOCUMENTS

| | | | |
|---|---|---|---|
| 7,642,128 B1 | 1/2010 | Lin et al. | |
| 7,888,172 B2 * | 2/2011 | Huang | H01L 21/565 438/107 |
| 8,097,490 B1 | 1/2012 | Pagaila et al. | |
| 8,133,762 B2 | 3/2012 | Pagaila et al. | |
| 8,193,604 B2 | 6/2012 | Lin et al. | |
| 8,268,677 B1 | 9/2012 | Pagaila | |
| 8,354,304 B2 | 1/2013 | Chow et al. | |
| 8,409,918 B2 * | 4/2013 | Yang | H01L 24/97 |
| 8,474,133 B2 | 7/2013 | Eichelberger et al. | |
| 8,742,579 B2 | 6/2014 | Pagaila et al. | |
| 8,759,964 B2 * | 6/2014 | Pu | H01L 21/561 257/690 |
| 8,796,846 B2 | 8/2014 | Lin et al. | |
| 8,829,676 B2 * | 9/2014 | Yu | H01L 21/568 257/737 |
| 8,877,554 B2 | 11/2014 | Tsai et al. | |
| 9,786,631 B2 * | 10/2017 | Yu | H01L 23/3128 |
| 2001/0011764 A1 | 8/2001 | Elenius et al. | |
| 2005/0027098 A1 | 2/2005 | Hayes | |
| 2005/0121765 A1 * | 6/2005 | Lin | H01L 24/82 257/686 |
| 2008/0316714 A1 | 12/2008 | Eichelberger et al. | |
| 2009/0166785 A1 | 7/2009 | Camacho et al. | |
| 2009/0224402 A1 * | 9/2009 | Do | H01L 21/568 257/738 |
| 2009/0261358 A1 | 10/2009 | Chitnis et al. | |
| 2010/0072599 A1 | 3/2010 | Camacho et al. | |
| 2010/0148360 A1 | 6/2010 | Lin et al. | |
| 2010/0155925 A1 * | 6/2010 | Kunimoto | H01L 21/561 257/690 |
| 2010/0258944 A1 * | 10/2010 | Uchiyama | H01L 24/82 257/773 |
| 2011/0018118 A1 | 1/2011 | Hsieh et al. | |
| 2011/0024903 A1 | 2/2011 | Badakere et al. | |
| 2011/0193216 A1 | 8/2011 | Lin et al. | |
| 2011/0221041 A1 | 9/2011 | Lin et al. | |
| 2012/0001328 A1 | 1/2012 | Chang et al. | |
| 2012/0012991 A1 | 1/2012 | Chandrasekaran et al. | |
| 2012/0056312 A1 * | 3/2012 | Pagaila | H01L 21/561 257/684 |
| 2012/0119378 A1 | 5/2012 | Ng et al. | |
| 2012/0217643 A1 | 8/2012 | Pagaila et al. | |
| 2012/0267777 A1 | 10/2012 | Haba et al. | |
| 2012/0319284 A1 | 12/2012 | Ko et al. | |
| 2013/0049214 A1 | 2/2013 | Nikitin et al. | |
| 2013/0241039 A1 | 9/2013 | Choi et al. | |
| 2013/0264684 A1 | 10/2013 | Yu et al. | |
| 2013/0277838 A1 | 10/2013 | Yu et al. | |
| 2014/0054760 A1 | 2/2014 | Yu et al. | |
| 2014/0077361 A1 | 3/2014 | Lin et al. | |
| 2014/0203443 A1 | 7/2014 | Pagaila et al. | |
| 2014/0225222 A1 | 8/2014 | Yu et al. | |
| 2014/0252572 A1 | 9/2014 | Hou et al. | |
| 2015/0200188 A1 | 7/2015 | Yu et al. | |
| 2015/0214127 A1 | 7/2015 | Gu et al. | |
| 2015/0221578 A1 | 8/2015 | Mahler | |
| 2016/0056056 A1 | 2/2016 | Chen et al. | |

\* cited by examiner

DEVICE PACKAGE INCLUDING MOLDING COMPOUND HAVING NON-PLANAR TOP SURFACE AROUND A DIE AND METHOD OF FORMING SAME

PRIORITY CLAIM AND CROSS-REFERENCE

This is a continuation application of U.S. application Ser. No. 15/717,300, entitled "Device Package Including Molding Compound Having Non-Planar Top Surface Around A Die", filed on Sep. 27, 2017, now U.S. Pat. No. 10,468,377, issued on Nov. 5, 2019, which is a divisional application of U.S. application Ser. No. 14/555,338, entitled "Device Package with Reduced Thickness and Method for Forming Same", filed on Nov. 26, 2014, now U.S. Pat. No. 9,786,631, issued on Oct. 10, 2017, which is related to commonly assigned U.S. patent application Ser. No. 14/464,487, entitled "Interconnect Structures for Wafer Level Package and Methods of Forming Same", filed on Aug. 20, 2014, now U.S. Pat. No. 9,484,285, issued on Nov. 1, 2016, which applications are incorporated herein by reference.

BACKGROUND

In an aspect of conventional packaging technologies, such as wafer level packaging (WLP), an interconnect structure, including redistribution layers (RDLs), may be formed over a die and electrically connected to active devices in a die. An advantageous feature of this packaging technology is the possibility of forming a fan-out interconnect structure. For example, I/O pads on a die can be redistributed to a greater area than the die, and hence the number of I/O pads packed on the surfaces of the dies can be increased.

In such packaging technologies, a molding compound may be formed around the die to provide extra surface area for supporting the fan-out interconnect structure. RDLs of the interconnect structure electrically connect I/O pads on the die to the external I/O pads on the fan-out interconnect structure. The external I/O pads may be disposed over both the die and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
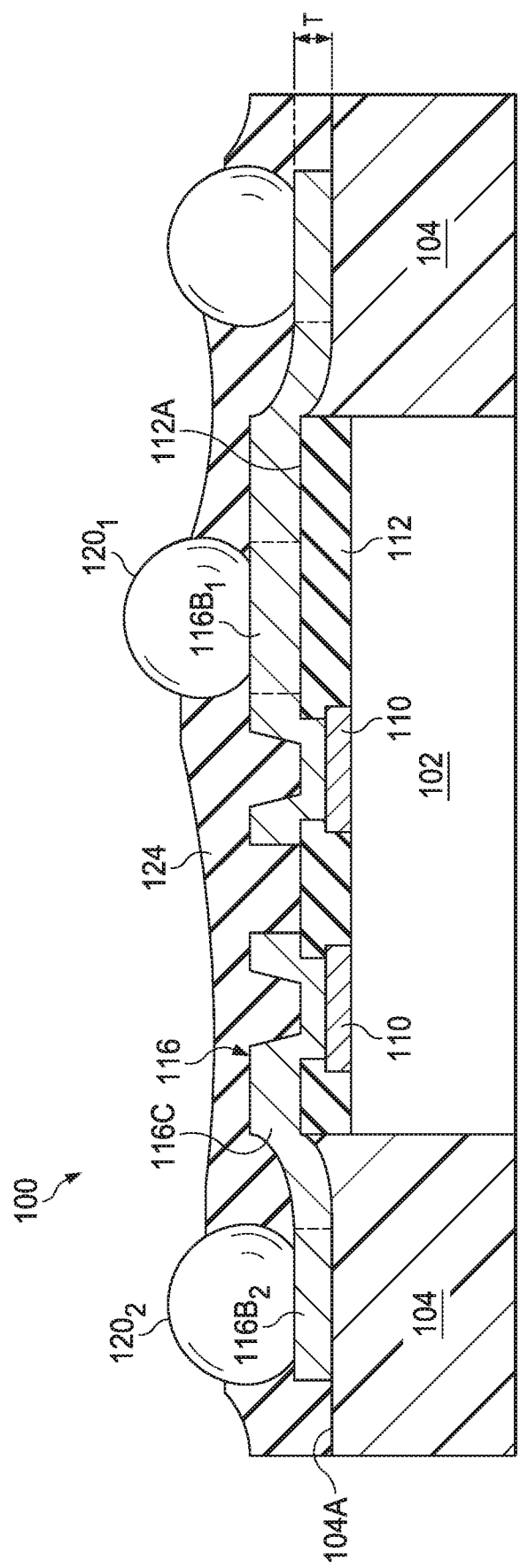
FIG. 1 illustrates a cross-sectional view of a device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Described below is a method for forming a device package and corresponding structure. In some embodiments, a molding compound is formed around a die using a transfer molding process. After the molding compound is formed, a top surface of the die may remain exposed. The formed molding compound may include a non-planar top surface. Afterwards, a fan-out interconnect structure is formed directly over the die and the molding compound. The fan-out interconnect structure extends beyond a boundary of the die to provide an extra area for retribution. A planarization layer for planarizing the molding compound is not needed. Overall thickness and manufacturing cost of the device package may be reduced.

FIG. 1 illustrates a cross-sectional view of a device package 100 in accordance with some embodiments. Device package 100 includes a die 102 and a molding compound 104 disposed around die 102. A fan-out interconnect structure 116 is formed over die 102 and extends onto molding compound 104. Die 102 may be a semiconductor die and could be any type of integrated circuit, such as a processor, logic circuitry, memory, analog circuit, digital circuit, mixed signal, and the like. In some embodiments, die 102 includes a substrate, active devices, and an interconnect structure (not individually illustrated). The substrate may include bulk silicon, doped or undoped, or an active layer of a semiconductor-on-insulator (SOI) substrate. Generally, an SOI substrate includes a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD) and plasma-enhanced CVD (PECVD). The interconnect structure electrically connects various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present disclosure and are not meant to limit the present disclosure in any manner. Other circuitry may be used as appropriate for a given application.

Die 102 may further include input/output (I/O) and passivation features formed over the interconnect structure. For example, pads 110 may be formed at the top surface of die 102. Pads 110 are electrically connected to the active devices through the various conductive features in the interconnect structure. Pads 110 include a conductive material such as aluminum, copper, and the like. Pads 110 may be surrounded by a passivation layer 112. In some embodiments, passivation layer 112 covers edge portions of pads 110. Passivation layer 112 includes silicon oxide, un-doped silicate glass, silicon oxynitride, polybenzoxazole (PBO), polyimide (PI), benzocyclobutene (BCB) although other suitable passivation materials may also be used. In some embodiments, passivation layer 112 has a thickness ranging from about 1 µm to about 100 µm.

Molding compound 104 is disposed around die 102. For example, in a top down view of molding compound 104/die 102 (not illustrated), molding compound 104 may encircle die 102. As will be described in greater detail in subsequent paragraphs, molding compound 104 may be formed using a transfer molding process, which does not cover a top surface of die 102. In addition, molding compound 104 includes a non-planar top surface recessed from the top surface of die 102, in some embodiments. Top surface 104A of molding compound 104 may be a non-planar portion (e.g., curved or linear inclined portion) recessed from top surface 112A of passivation layer 112, for example. In some embodiments, top surface 104A further includes a substantially flat portion on a side of the non-planar portion of molding compound 104 away from die 102. Non-planar top surface 104A of molding compound 104 may have a total thickness variation T (e.g., distance between a highest point and a lowest point of the top surface) of about 1 µm to about 10 µm, for example. In some embodiments, there is no abrupt slope change on top surfaces 112A and 104A of passivation layer 112 and molding compound 104 and the interface therebetween. Molding compound 104 may include epoxy, polyimide, benzocyclobutene (BCB), polybenzoxazole (PBO) or a combination thereof, with or without filler embedded therein. The filler may include carbon filler or glass filler.

An interconnect structure 116 is disposed over die 102. For example, the interconnect structure 116 may include a redistribution layer 116R disposed over pads 110 and passivation layer 112. Redistribution layer 116R may extend outside a boundary of die 102 and onto molding compound 104. Thus, interconnect structure 116 enables a fan-out function for die 102 and is thereby sometimes called as a fan-out interconnect structure 116. Redistribution layer 116R includes contact pads $116B_1$ over the die 102 (i.e., inside the boundary of die 102), contact pads $116B_2$ over molding compound 104 (i.e., outside the boundary of die 102) and redistribution lines 116C electrically connecting contact pads $116B_1$ and $116B_2$ to pads 110. In some embodiments, redistribution layer 116R is directly formed on die 102 and molding compound 104A with no planarization layer interposed therebetween. Redistribution lines 116R and contact pads $116B_2$ may be in direct contact with and conformal to non-planar top surface 104A of molding compound 104. In some embodiments, contact pads $116B_1$ and $116B_2$ and redistribution lines 116R is formed copper or copper alloy. Alternatively, contact pads $116B_1$ and $116B_2$ and redistribution lines 116R include aluminum, titanium, titanium nitride or other suitable conductive materials.

Additional package features, such as connectors 120, are mounted to contact pads $16B_1$ and contact pads $116B_2$. Some of connectors 120, such as connectors $120_1$, are mounted on contact pads $116B_1$, and some of connectors 120, such as connectors $120_2$, are mounted on contact pads $116B_2$. Connectors 120 may be ball grid array (BGA) balls. Connectors 120 may be used to electrically connect device package 100 to other package components such as another device die, an interposer, a package substrate, a printed circuit board, a mother board, and the like. Connectors 120 may have a thickness ranging from about 100 µm to about 300 µm. In some embodiments, each of connectors $120_1$ and $120_2$ has substantially the same size (including thickness and width). In some embodiments, uneven top surfaces of connectors $120_1$ and $120_2$ resulting from total thickness variance T are compensated or negated by the warpage of device package 100 when device package 100 is bonded with other package components.

A molded underfill 124 may be disposed over redistribution layer 116R and around connectors 120 to provide structural support to connectors 120 and/or protection to underlying device layers. In some embodiments, the molded underfill 124 includes a material the same as or similar to that of molding compound 104 for reducing warpage resulting from coefficient of thermal expansion (CTE) differences. In other embodiments, molded underfill 124 includes a material different from that of molding compound 104 for other applications. Molded underfill 124 may also be formed by a transfer molding process and therefore have a non-planar top surface. Alternatively, molded underfill 124 may be formed by any other suitable molding process.

Figure 2:
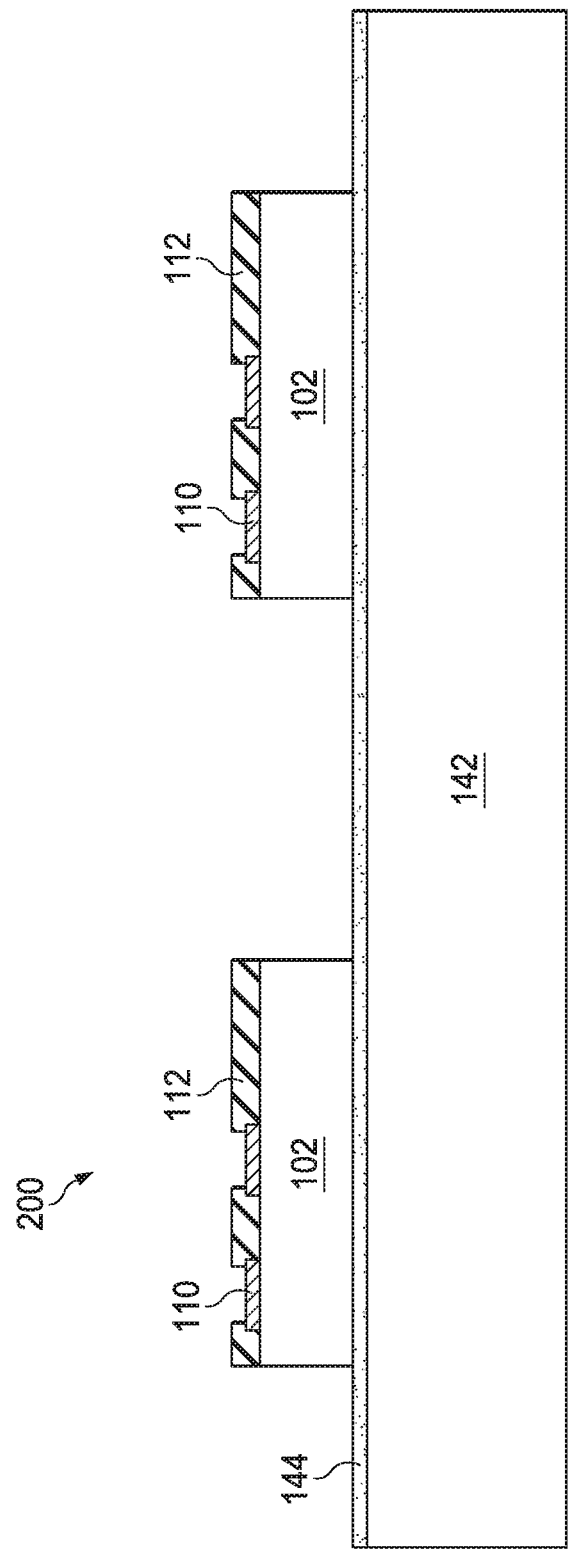
FIGS. 2 through 9 illustrate cross-sectional views of intermediary steps of manufacturing a device package in accordance with some embodiments.

FIGS. 2 through 9 illustrate cross-sectional views of intermediary stages of forming a device package 200 in accordance with some embodiments. Referring to FIG. 2, dies 102 are mounted on a carrier 142. Carrier 142 provides temporary mechanical and structural support to the dies 102 during subsequent processing steps. In this manner, damage to dies 102 is reduced or prevented. Carrier 142 may include, for example, glass, silicon oxide, aluminum oxide, and the like. A temporary adhesive layer 144 (e.g., a glue layer, a light-to-heat conversion (LTHC) coating, an ultraviolet (UV) film, and the like) is disposed over carrier 142. In addition, dies 102 may be temporarily affixed to carrier 142 using a die attach film (DAF)) (not shown) disposed on a backside of dies 102. In some embodiments, the die attach film is an epoxy resin, a phenol resin, acrylic rubber, silica filler or a combination thereof.

Figure 3:
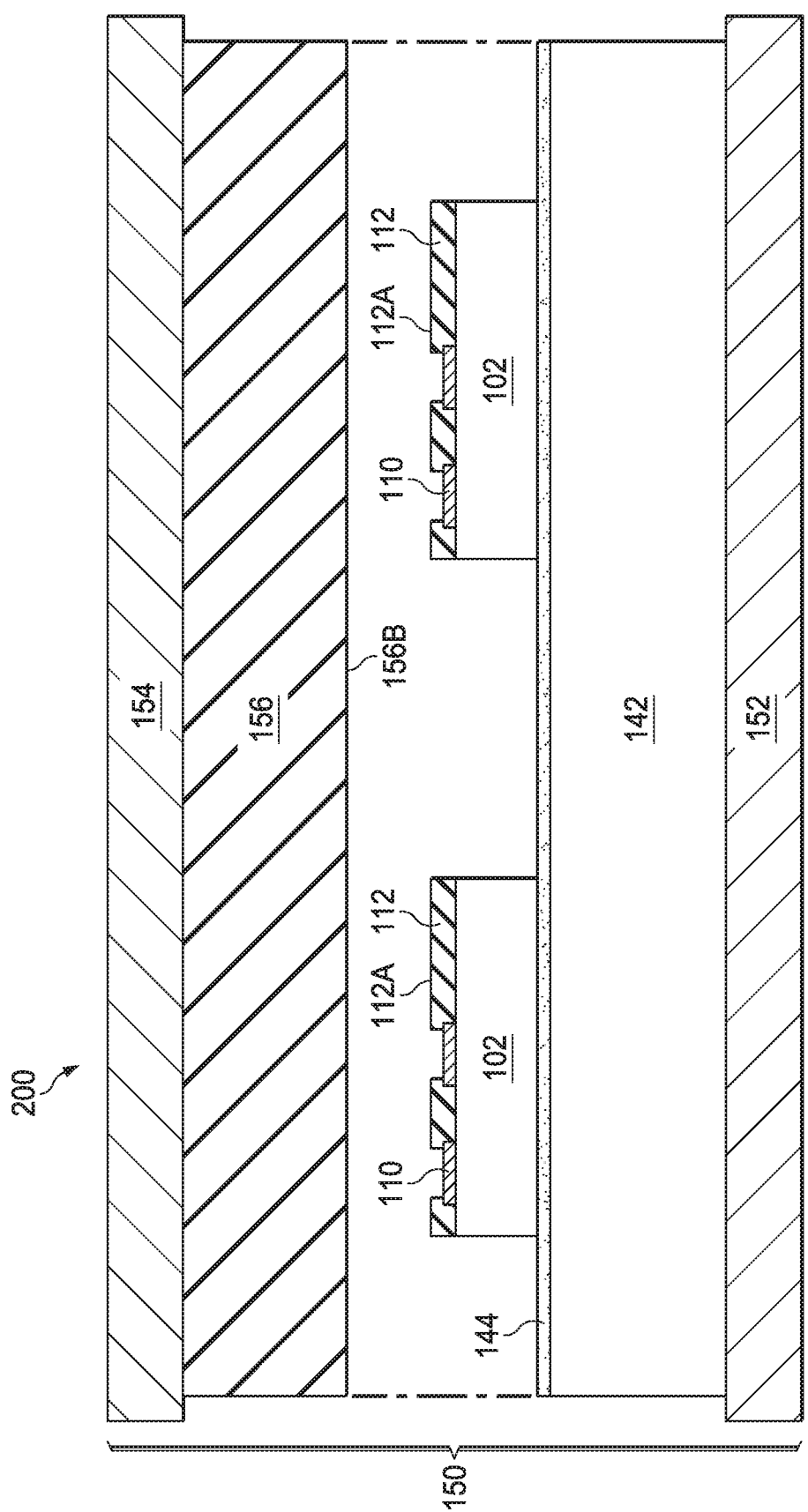
Figure 4:
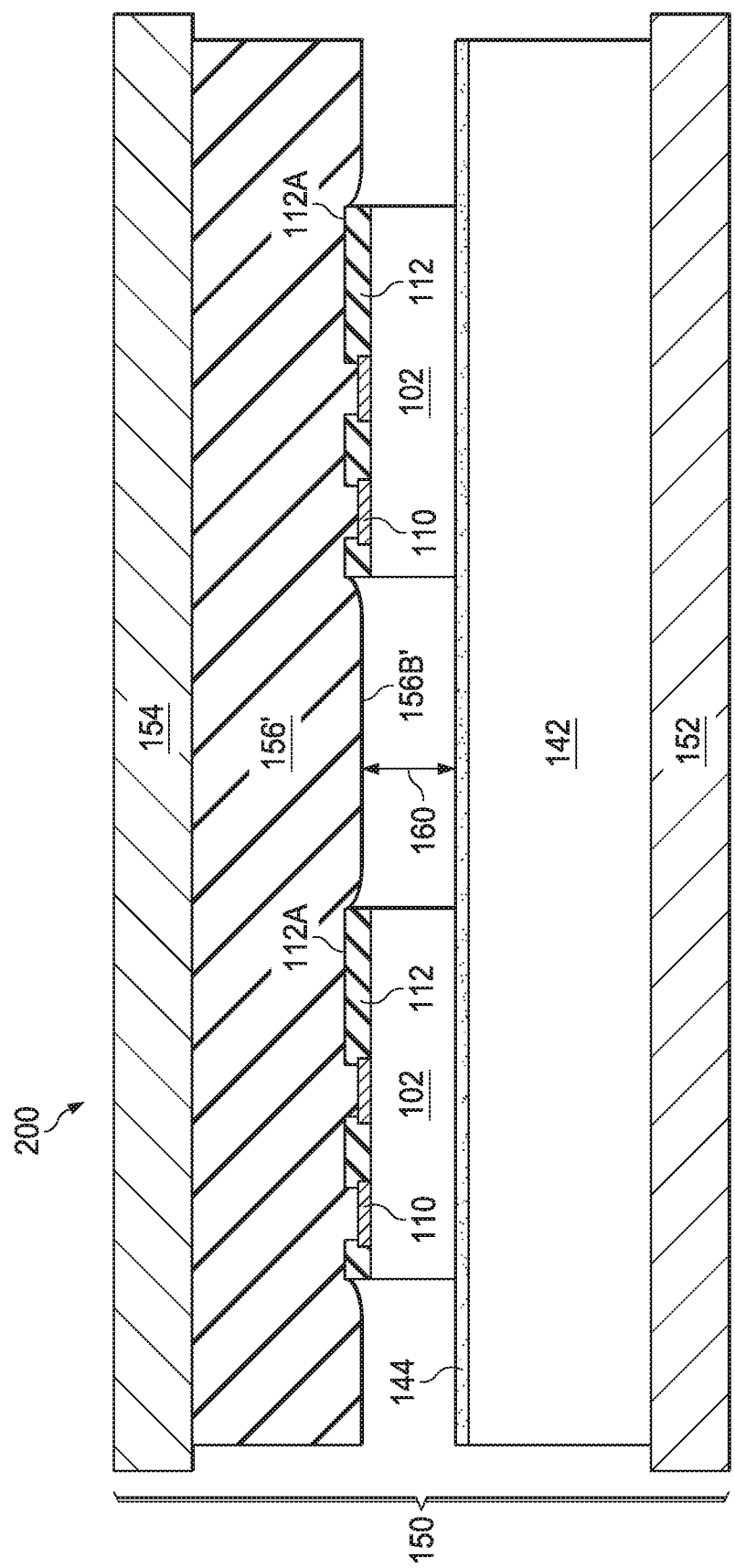
Figure 5:
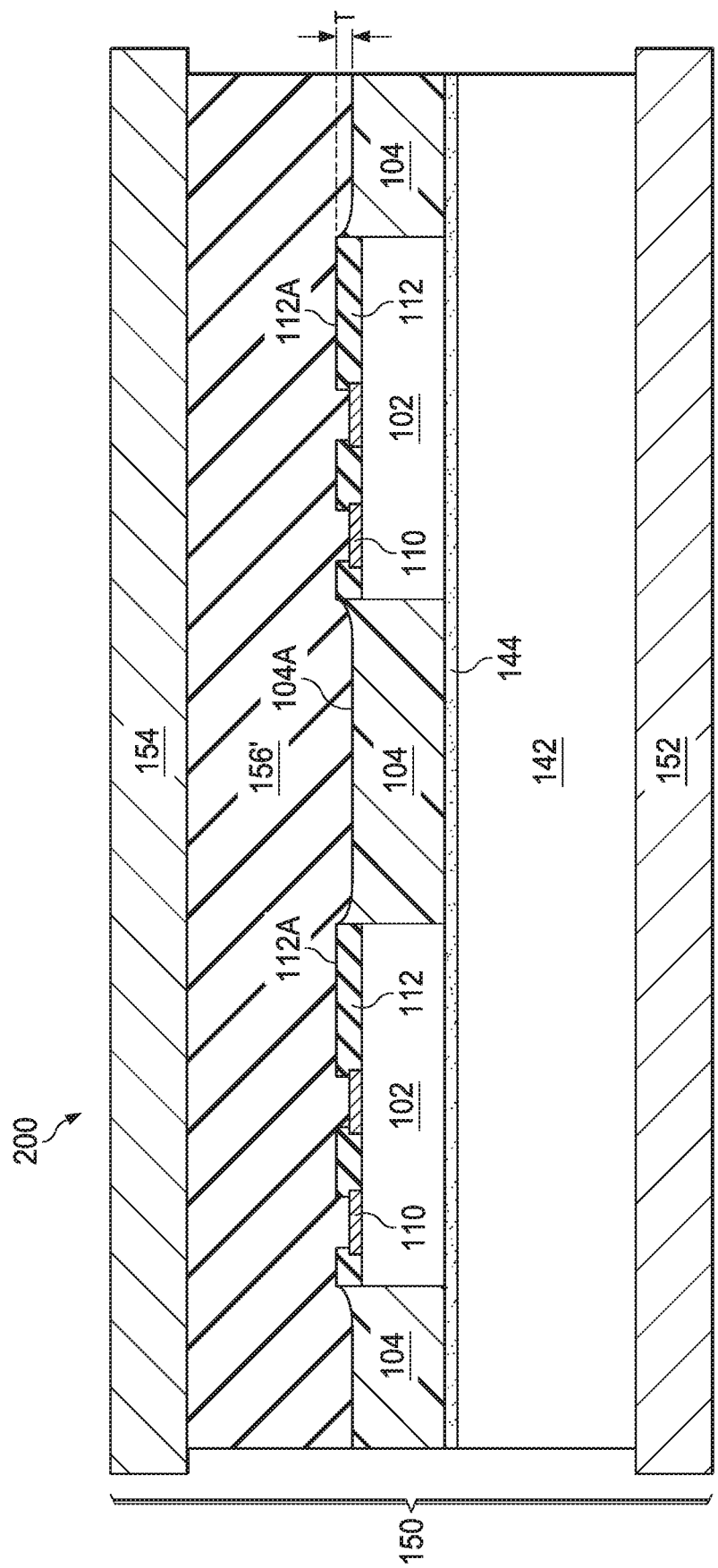

FIGS. 3 through 5 illustrate a transfer molding process. Referring to FIG. 3, a carrier 142 (having dies 102 mounted thereto) is positioned between a bottom plate 152 and a top plate 154 of a molding apparatus 150. Top and bottom plates 152 and 154 may include a suitable material for providing structural support such as a metal, ceramic, or the like.

In some embodiments, a polymer layer 156 is disposed on top plate 154 (e.g., facing dies 102). Polymer layer 156 may include a lamination film material, such as polyimide, PBO, epoxy, an underfill film, a molded underfill film, and the like either with or without a filler material. Polymer layer 156 may be compressible such that it may be shaped by dies 102 when polymer layer 156 contacts to dies 102. In some embodiments, polymer layer 156 has a thickness ranging from about 10 µm to about 100 µm. In some embodiments, a release film (not shown) is disposed between top plate 154 and polymer layer 156.

Afterwards, referring to FIG. 4, top and bottom plates 152 and 154 are pressed together, and polymer layer 156' contacts the top surface of dies 102. Polymer layer 156' may cover the top surface of dies 102 (e.g., cover pads 110 and passivation layer 112). Gaps 160 may remain disposed between dies 102 and under polymer layer 108. The lack of any support material under polymer layer 156' may result in a non-planar bottom surface 156B' of polymer layer 156'. For example, as shown in FIG. 4, polymer layer 156' is partially compressed by dies 102. A portion of bottom surface 156B' of polymer layer 156' in the gaps 160 is lower than top surface 112A of passivation layer 112. In some embodiments, non-planar bottom surface 156B' in the gaps 160 includes a non-planar portion recessed from top surface 112A of passivation layer 112. In some embodiments, bottom surface 156B' further includes a substantially flat portion away from dies 102. Prior to its placement on dies 102, polymer layer 156' may be uncured or only partially cured. Non-planar bottom surface 156B' of polymer layer 156' may have a total thickness variation T (e.g., distance between a highest point and a lowest point of the bottom surface) of about 1 µm to about 10 µm. Total thickness variation T may be a variable of the spacing of dies 102.

Afterwards, referring to FIG. 5, molding compound 104 is formed in gaps 160. In some embodiments, molding compound 104 is dispensed between dies 102 (e.g., in gaps 160) in liquid form. Molding compound 104 may not flow over top surfaces of dies 102 since it is sealed by polymer layer 156'. Afterwards, a curing process may be performed to solidify molding compound 104. During the molding process, top surface 104A of molding compound 104 may contact bottom surface 156B' of polymer layer 156, and thus top surface 104A of molding compound 104 may have a similar profile as the bottom surface 156B' of polymer layer 156'. As a result, top surface 104A of molding compound 104 is a non-planar surface recessed from the top surfaces of dies 102. For example, top surface 104 of molding compound 104 may be recessed from the top surface 112A of passivation layer 112. In some embodiments, top surface 104A of molding compound 104 includes a curved or linear inclined portion recessed from the top surface of dies 102. In some embodiments, top surface 104A of molding compound 104 further includes a substantially flat portion away from dies 102. Due to the similar profile as the bottom surface 156B' of polymer layer 156, top surface 104A of molding compound 104 also has the total thickness variation T (e.g., distance between a highest point and a lowest point of the top surface) of about 1 µm to about 10 µm.

Figure 6:
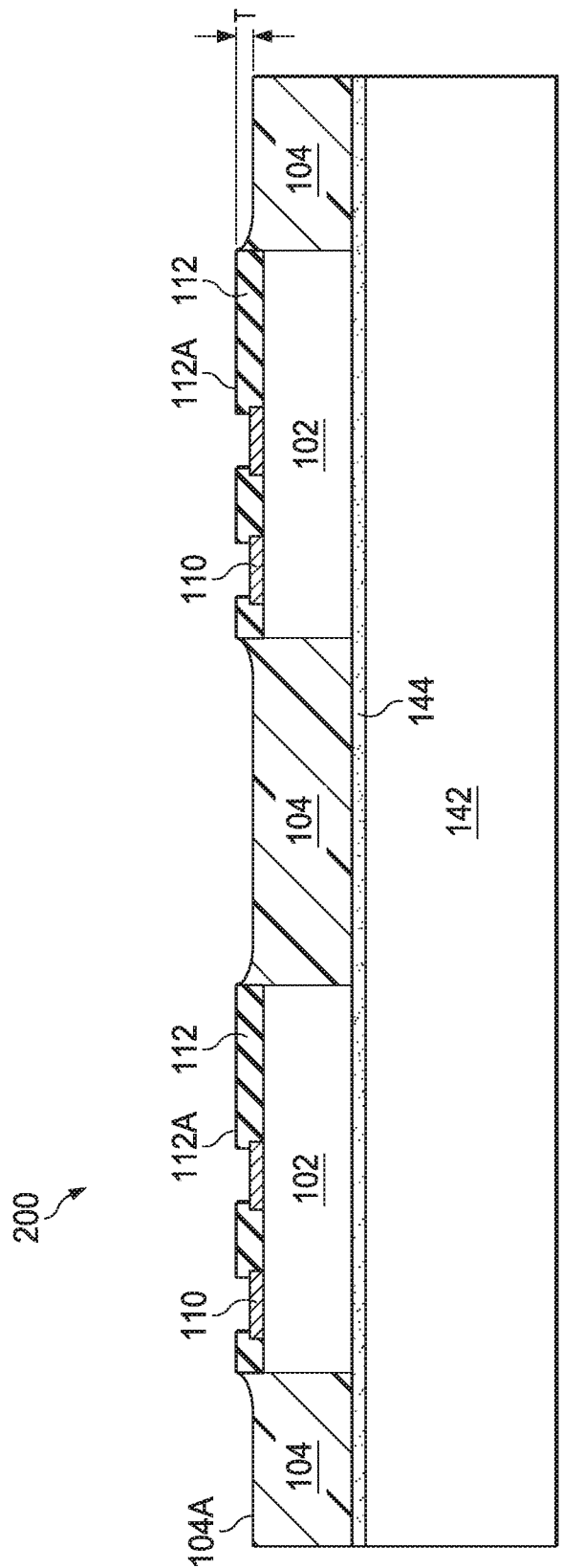

Afterwards, referring to FIG. 6, when molding apparatus 150 is removed, top surfaces of pads 110, passivation layer 112 and molding compound 104, remain exposed. Top surface 104A of molding compound 104 may be treated by plasma for providing a cleaner and rougher surface for adhesion improvement.

Figure 7:
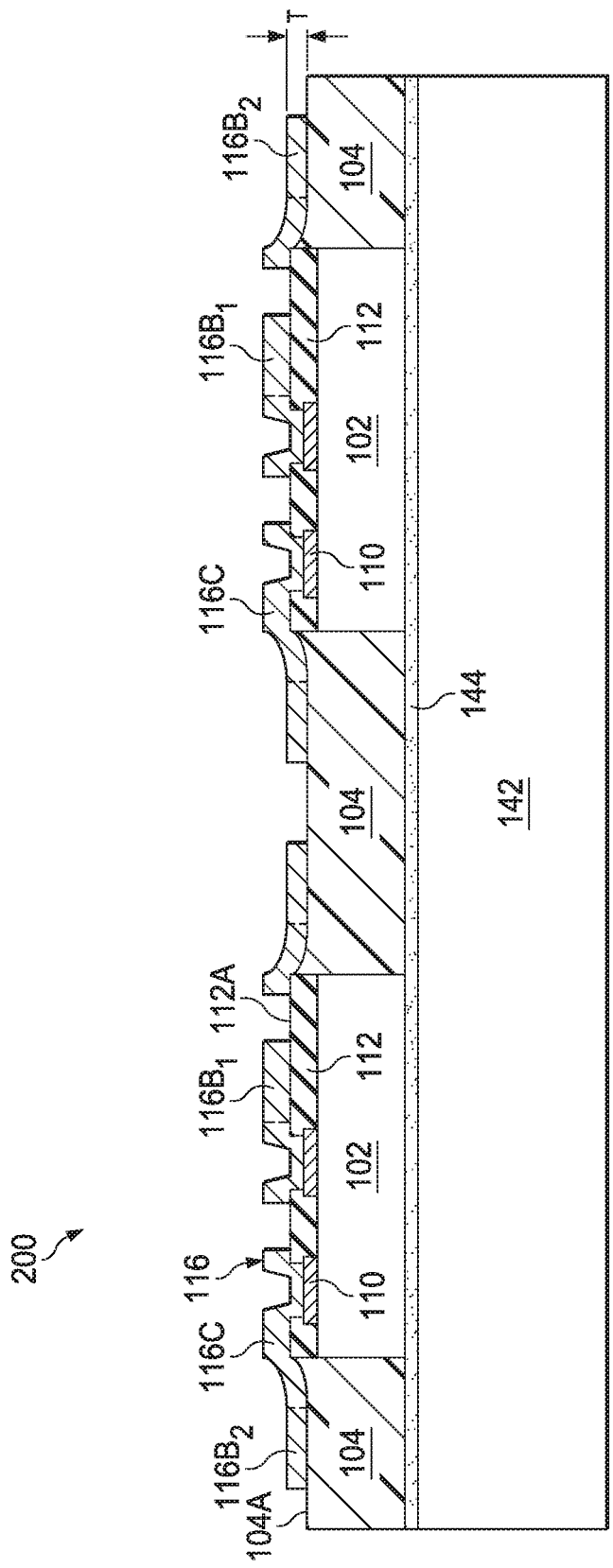

Referring to FIG. 7, redistribution layer 116R is formed over passivation layer 112 and molding compound 104. The formation of redistribution layer 116R may include depositing a seed layer (not shown), coating a photoresist layer (not shown) over the seed layer, forming various openings to define the shape of contact pads $116B_1$ and $116B_2$ and redistribution lines 116C by a lithography process, filling the openings in the mask layer using an electro-chemical plating process, and removing the seed layer from exposed areas, for example. An exemplary photolithography process may include processing steps of photoresist coating, soft baking, photo-mask aligning, exposing through the photo-mask, post-exposure baking, developing photoresist and hard baking. The photoresist may then be removed. In such embodiments, the interconnect structure 116 is formed of a single redistribution layer 116R and may be formed using one photo-mask.

Figure 8:
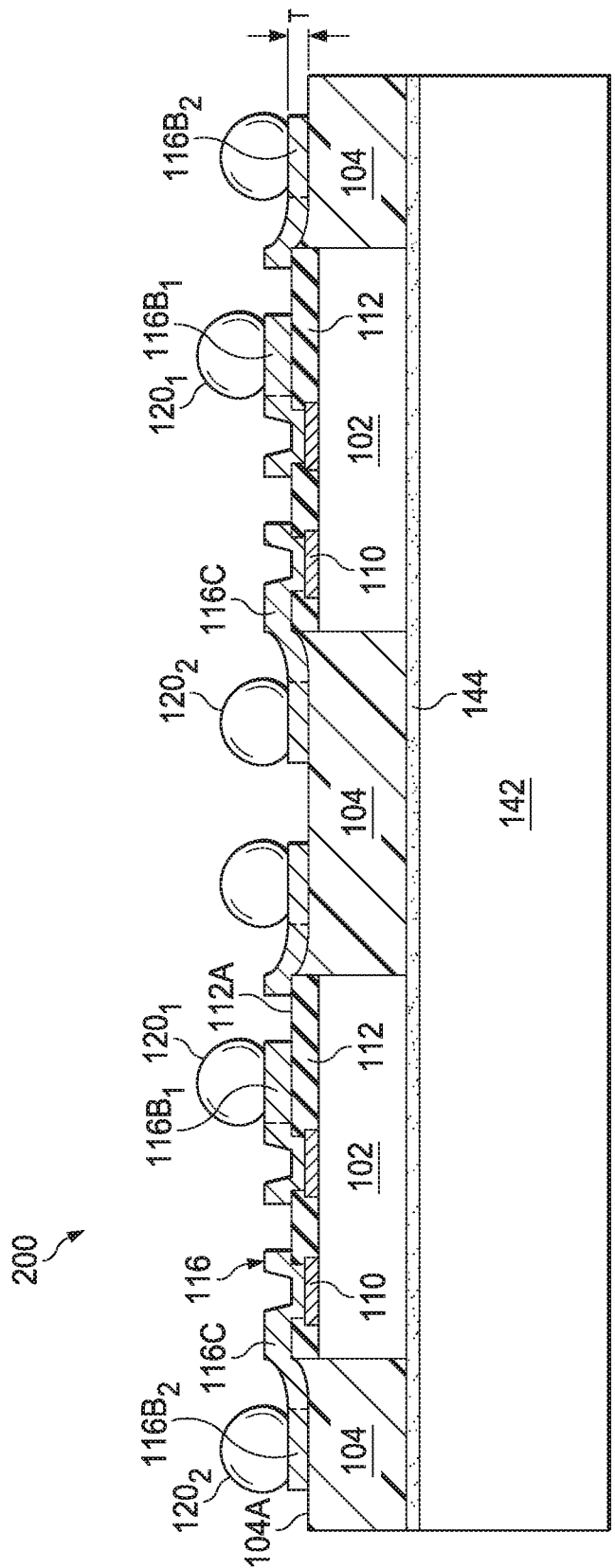

Afterwards, referring to FIG. 8, connectors 120 are mounted to contact pads $116C_1$ and $116C_2$. In some embodiments, connectors 120 are made of conductive materials, such as solder, solder alloy, copper, copper alloy, gold, or gold alloy, etc. The connectors 120 may be mounted to contact pads $116B_1$ and $116B_2$ by a solder reflow process. In some embodiments, connectors 120 have a thickness of about 100 µm to about 300 µm.

Figure 9:
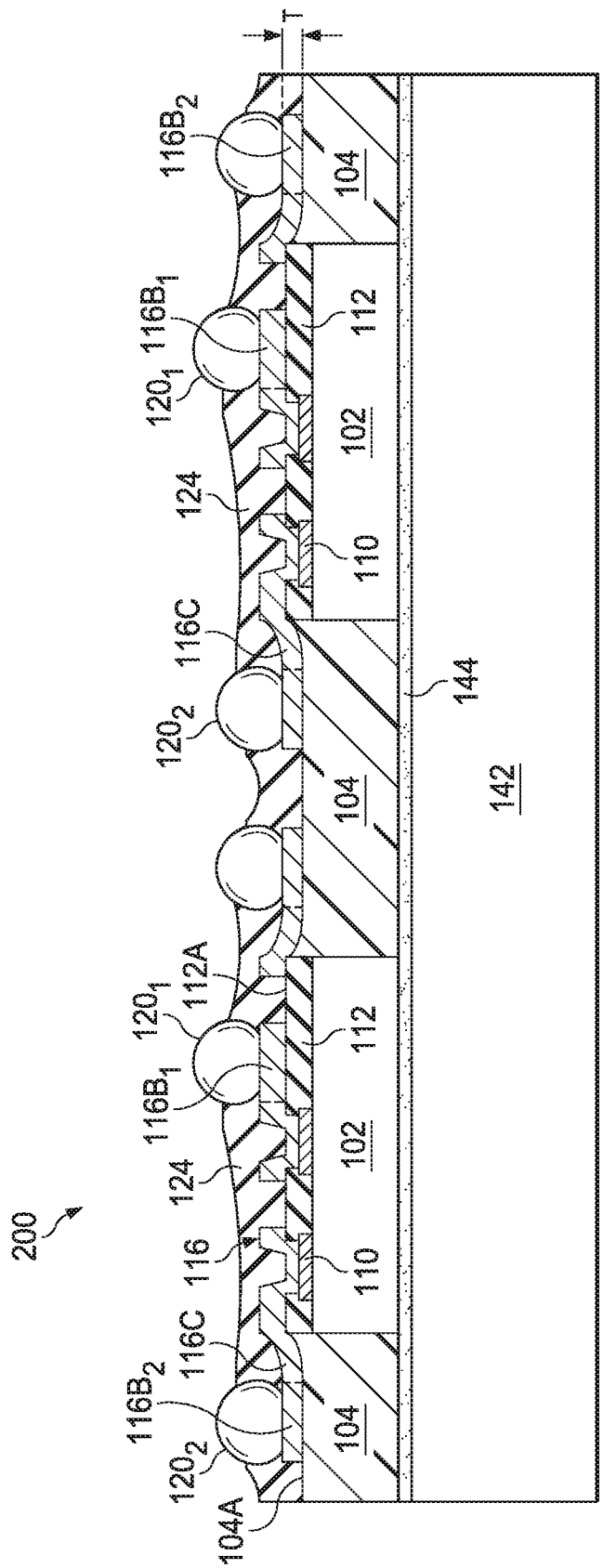

Afterwards, referring to FIG. 9, a molded underfill 124 is formed around connectors $120_1$ and $120_2$. Molded underfill 124 may be also formed by the transfer molding process and therefore have a non-planar top surface. Alternatively, molded underfill 124 may be formed by any other suitable molding process.

After the molded underfill 124 is formed, device package 200 is diced to form separated chip packages, such as package 100 as shown in FIG. 1. In some embodiments, the dicing of device package 200 includes placing device package 200 on a dicing tape; removing carrier 142; and dicing molding compound 104 along scribing lines SC to separate dies 102.

Figure 10:
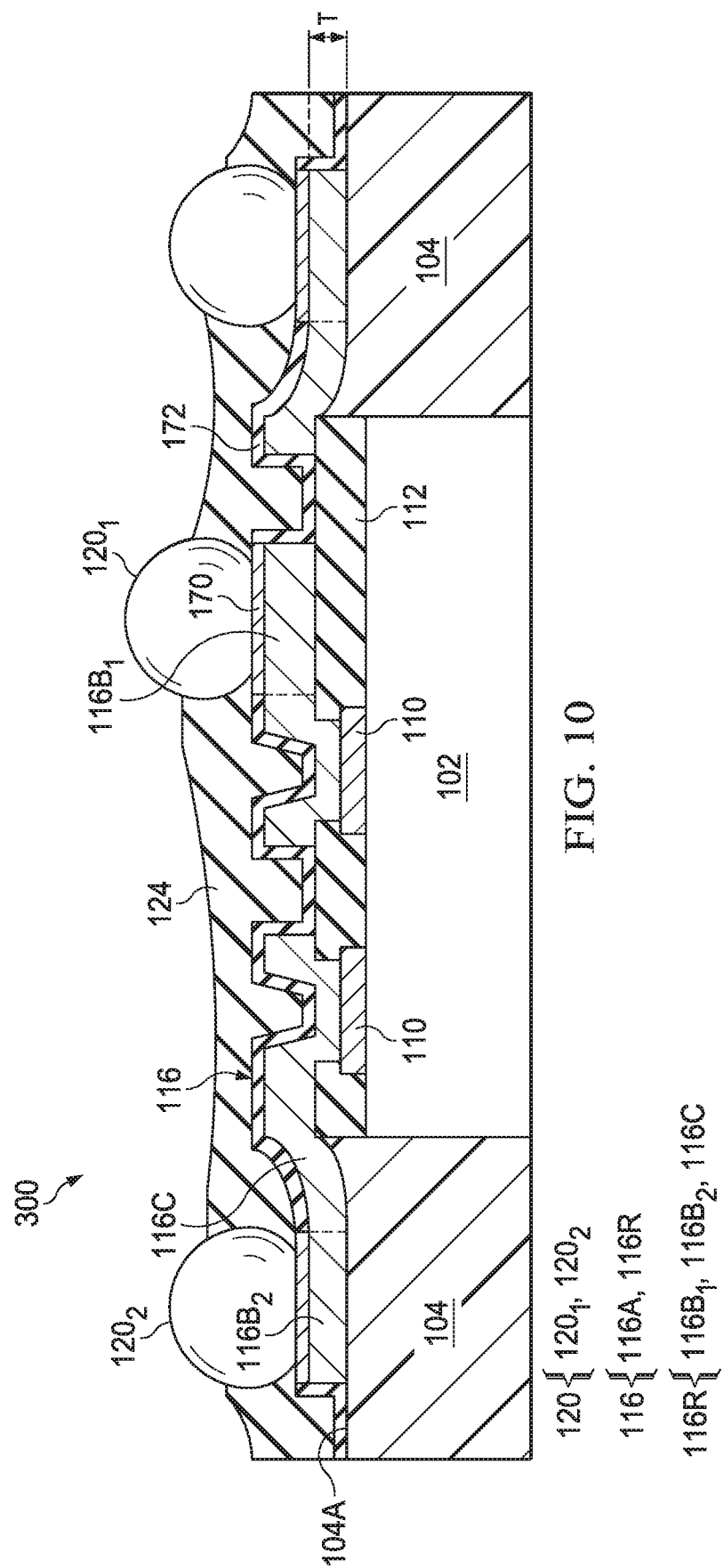
FIGS. 10 through 12, 13A through 13B, and 14 through 15 illustrate cross-sectional views of device packages in accordance with some other embodiments.

FIG. 10 shows a device package 300 in accordance with some embodiments. Device package 300 is similar with device package 100 but with under bump metallurgy (UBM) structures 170 disposed under connectors 120. For example, at an intermediate stage of manufacturing device package 200, such as after the formation of redistribution layer 116R in FIG. 7, a passivation layer 172 is formed over redistribution layer 116R while exposing contact pads $116B_1$ and $116B_2$. Afterwards, UBM structures 170 are formed over contact pads $116B_1$ and $116B_2$ for achieving greater adhesion and barrier function between connectors 120 and contact pads $120B_1$ and $120B_2$. In some embodiments, passivation layer 172 includes silicon oxide, un-doped silicate glass, silicon oxynitride, polybenzoxazole (PBO), polyimide (PI), benzocyclobutene (BCB) although other suitable passivation materials may also be used. Passivation layer 172 may have a thickness ranging from about 10 µm to about 100 µm. In some embodiments, each of UBM structures 170 includes multi-layers of conductive materials such as Ti, Cu, Ni, Au, Ag, an alloy thereof or a combination thereof.

Device package 300 as shown in FIG. 10 is formed after the formation of connectors 120 and molded underfill 124 and the dicing.

Figure 11:
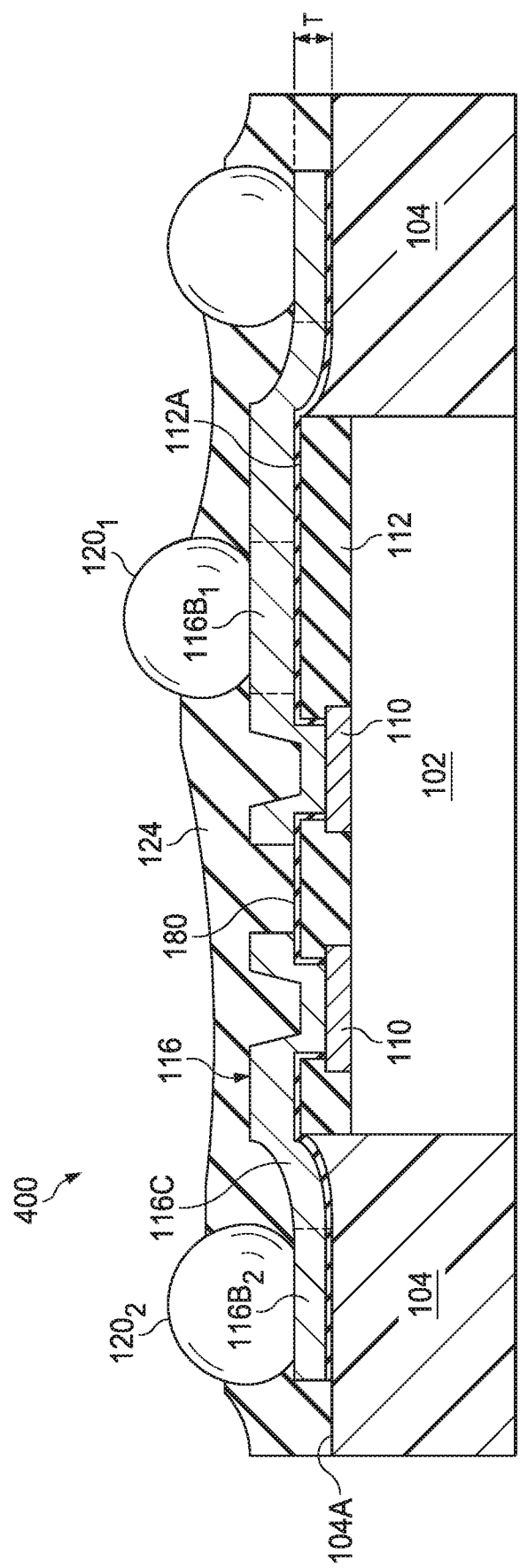
Figure 12:
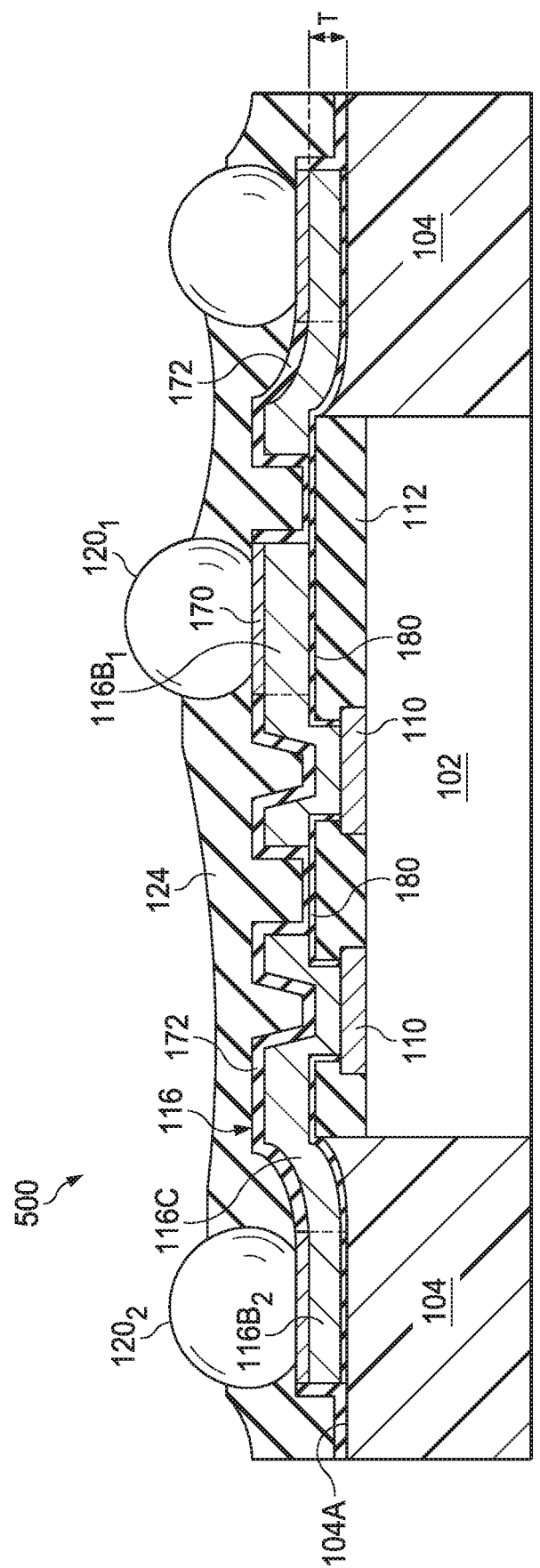

FIG. 11 shows a device package 400 in accordance with some embodiments. Device package 400 is similar with device package 100 but with an additional passivation layer 180 interposed between interconnect structure 116 and passivation layer 112 and molding compound 104. For example, in an intermediate stage of manufacturing device package 200, such as after the formation of molding compound 104 as shown in FIG. 6, additional passivation layer 180 is formed over passivation layer 112 and molding compound 104 while exposing pads 110. Afterwards, interconnect structure 116 is formed over pads 110 and additional passivation layer 180. In some embodiments, device package 400 as shown in FIG. 11 is formed after the formation of connectors 120 and molded underfill 124 and the dicing. In other embodiments, device package 500 as shown in FIG. 12 is formed by similar steps with device package 400 except that UBM structures 170 and passivation layer 172 are formed before the formation of connectors 120.

Figure 13A:
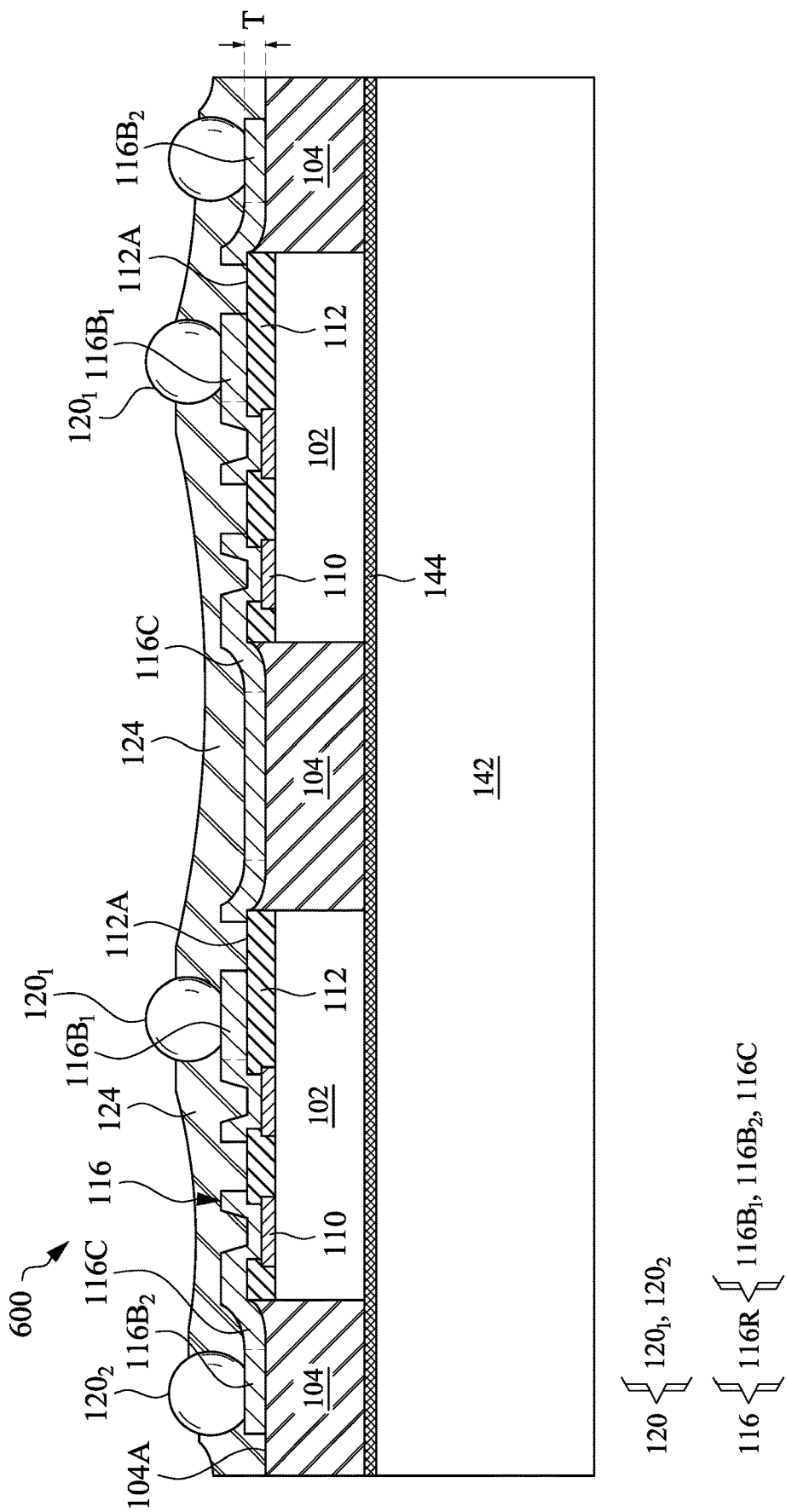
Figure 13B:
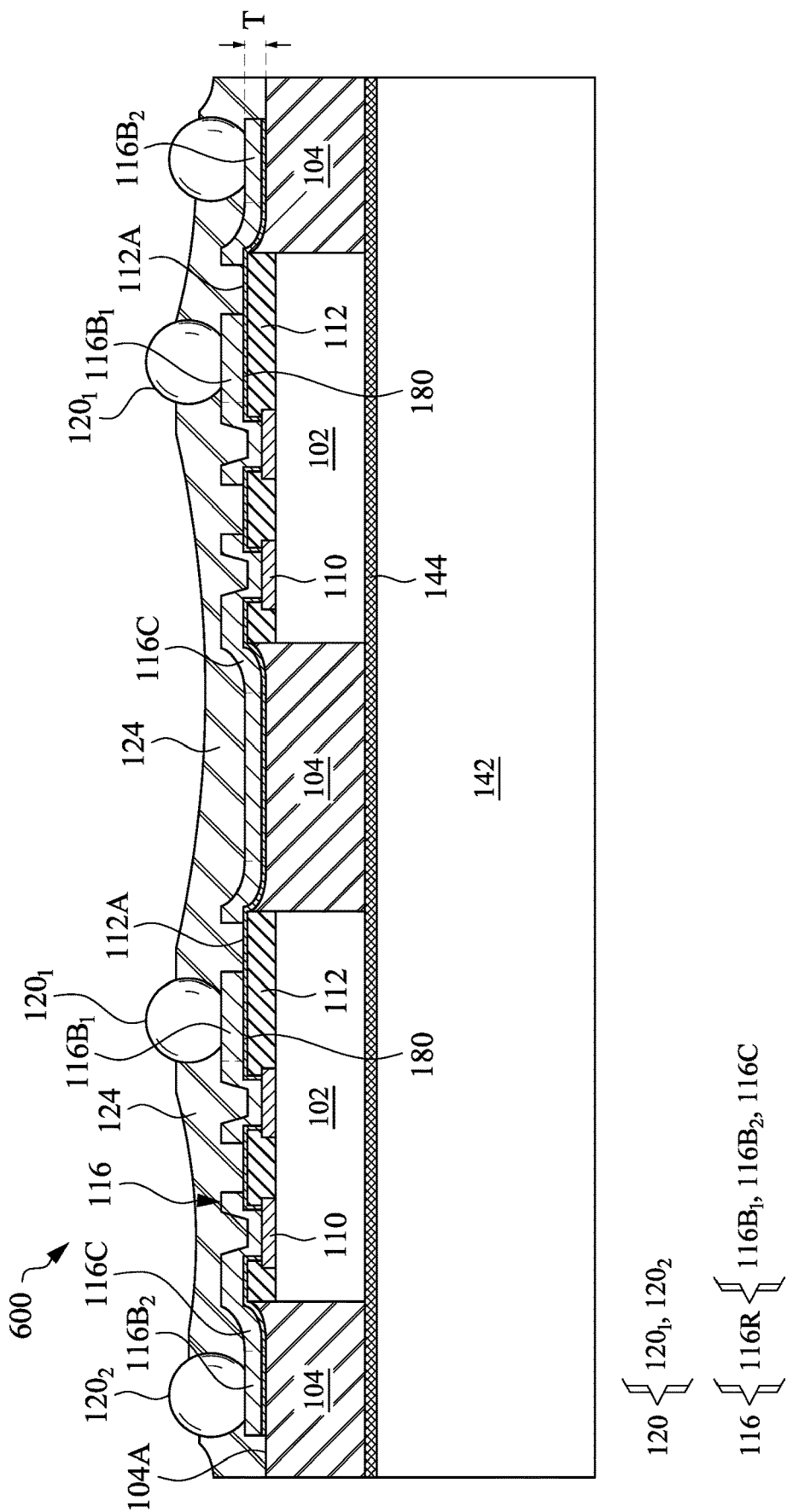

FIGS. 13A and 13B show a device package 600 in accordance with some embodiments. Device package 600 may include a plurality of dies 102. For example, device package 600 may include two dies 102 disposed within molding compound 104 although any number of dies 102 may be included in device package 600. In some embodiments, at least two dies 102 are electrically connected to each other through redistribution line 116C on non-planar top surface 104A of molding compound 104. Device package 600 may be diced from device package 200 as shown in FIG. 9 with defining scribing lines in specific regions. As illustrated in FIG. 13B, in some embodiments, device package 600 also includes UBM structures 170 and/or passivation layer 180 over each die 120 and molding compound 104.

Figure 14:
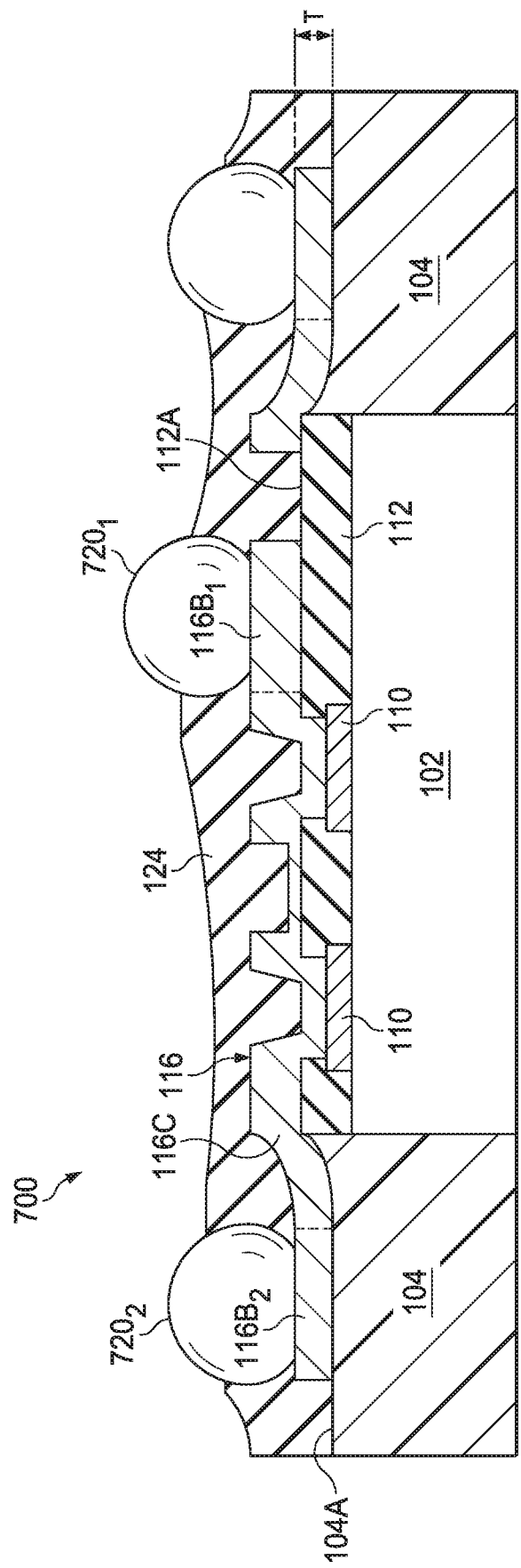

FIG. 14 shows a device package 700 in accordance with some embodiments. Device package 700 is similar with device package 100 but includes connectors $720_1$ and $720_2$ that have different volumes to each other. For example, connectors $720_2$ may have a greater volume than that of connectors $720_1$, which makes connectors $720_2$ have a greater thickness and a greater width than that of connectors $720_1$. Due to the thickness difference between connectors $720_1$ and $720_2$, top surfaces of connectors $720_1$ and $720_2$ may be level with each other to facilitate device package 700 to bond other package components in the presence of total thickness variance T and package warpage. In some embodiments, the thickness difference between connectors $720_1$ and $720_2$ is substantially the same as the total thickness variance T although the thickness difference can be any suitable value.

Figure 15:
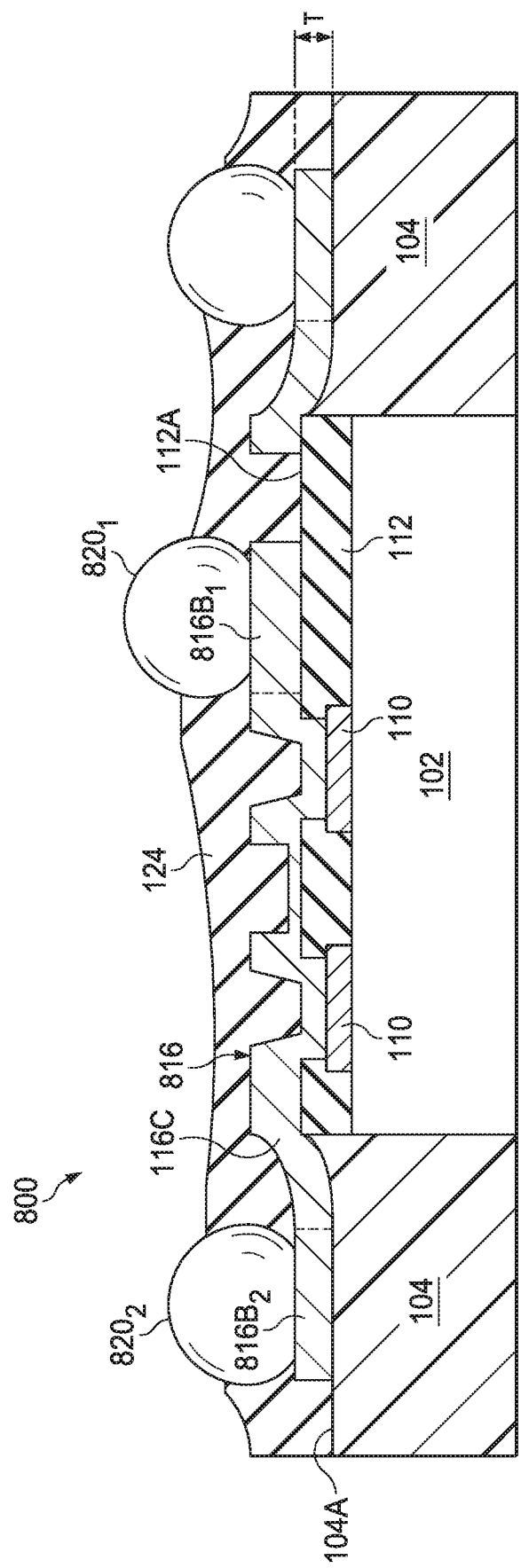

FIG. 15 shows a device package 800 in accordance with some embodiments in the present disclosure. Device package 800 is similar with device package 100, but contact pads $816B_1$ have a surface area different from that of contact pads $816B_2$. Connectors $820_2$ on contact pads $816B_2$ may have different thicknesses to each other while each of connectors $820_1$ and $820_2$ has substantially the same volume. For example, contact pads $816B_1$ have a smaller surface area than that of contact pads $816B_2$, and connectors $820_2$ on contact pads $816B_2$ have a greater thickness than that of connectors $820_1$ on contact pads $816B_1$ while each of connectors $820_1$ and $820_2$ has substantially the same volume. Due to the thickness difference between connectors $820_1$ and $820_2$, top surfaces of connectors $820_1$ and $820_2$ may be level with each other to facilitate device package 800 to bond other package components in the presence of total thickness variance T and package warpage. In some embodiments, the thickness difference between connectors $820_1$ and $820_2$ is substantially the same as the total thickness variance T although the thickness difference can be any suitable value.

Figure 16:
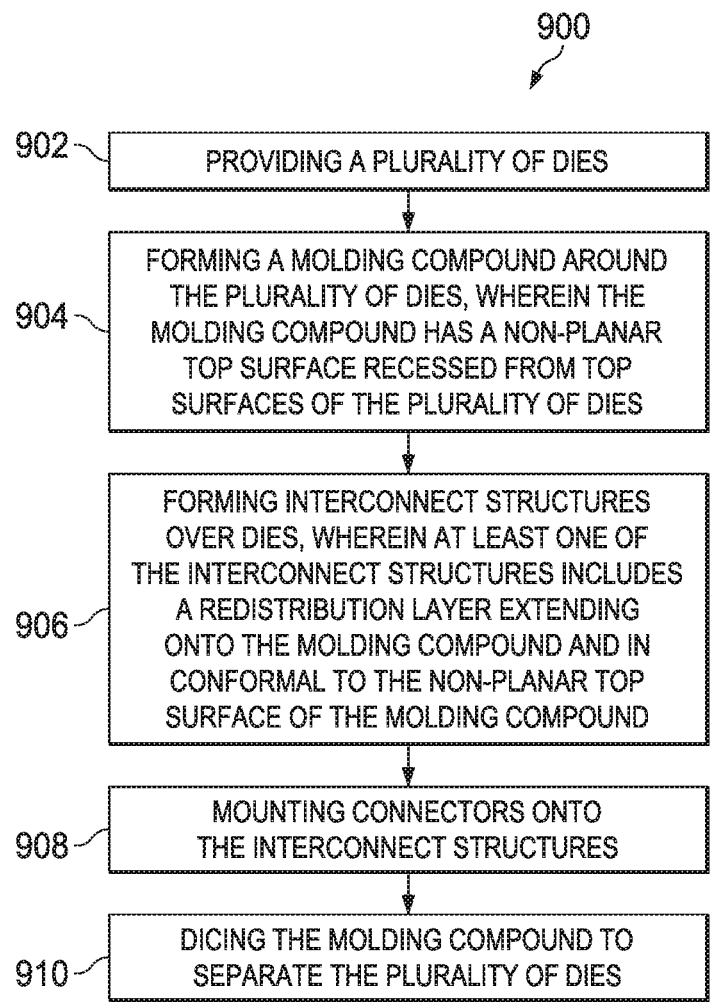
FIG. 16 illustrates a method for forming a device package in accordance with some embodiments.

FIG. 16 illustrates a method 900 for forming a package in accordance with various embodiments. The method 900 starts with operation 902, in which a plurality of dies is provided. Each of the plurality of dies includes pads surrounded by a passivation layer at a top surface of the dies. The method 900 continues to operation 904, in which a molding compound is formed around the plurality of dies. The molding compound has a non-planar top surface recessed from the top surface of dies. The method 900 continues to operation 906, in which interconnect structures are formed over the dies. At least one of the interconnect structures includes a redistribution layer extending onto the molding compound and being conformal to the non-planar top surface of the molding compound. The method 900 continues to operation 908, in which connectors are mounted to the interconnect structures. The method 900 continues to operation 910, in which the molding compound is diced to separate the plurality of dies.

The embodiments of the present disclosure offer advantages over existing art, though it is understood that other embodiments may offer different advantages, not all advantages are necessarily discussed herein, and that no particular advantage is required for all embodiments. By utilizing the disclosed device package and its manufacturing method, the overall thickness and fabrication cost can be reduced because the fan-out interconnect structure is directly disposed on the die and a non-planar surface of the molding compound. A planarization layer for planarizing the top surface of the molding compound is omitted.

In accordance with an embodiment, a device package includes a die and a molding compound around the die. The molding compound has a non-planar surface recessed from a top surface of the die. The device package also includes an interconnect structure disposed over the die. The interconnect structure includes a redistribution layer extending onto the molding compound and being conformal to the non-planar surface of the molding compound. The device package further includes a first connector disposed over the die and mounted onto the interconnect structure.

In accordance with another embodiment, a device package includes a first die and a second die disposed within a molding compound. The molding compound comprises a non-planar top surface recessed from the first die and the second die. The device package also includes a first interconnect structure disposed over the first die and extending onto the non-planar top surface of the molding compound. The first interconnect structure includes a first contact pad disposed over the first die. The device package further includes a second interconnect structure disposed over the first die and extending onto the non-planar top surface of the molding compound. In addition, the device package includes a redistribution line disposed over the non-planar surface of molding compound and extending form the first interconnect structure to the second interconnect structure. Furthermore, the device package includes a first connector mounted onto the first contact pad.

In accordance with yet another embodiment, a method for forming a device package includes providing a plurality of dies. The method also includes forming a molding compound around the plurality of dies. The molding compound has a non-planar top surface recessed from top surfaces of the dies. The method further includes forming interconnect structures over the plurality of dies. Each of the interconnect structures includes a redistribution layer extending onto the molding compound and being conformal to the non-planar surface of the molding compound. In addition, the method includes mounting connectors onto the interconnect structures. The method includes dicing the molding compound to separate the plurality of dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
attaching a first die and a second die to a carrier, each of the first die and the second die comprising:
a substrate;
a plurality of contact pads disposed over the substrate; and
a passivation layer disposed over the plurality of contact pads;
pressing a polymer layer over the first die and the second die, the pressing forming an air gap between the first die and the second die in a lateral direction, the air gap being between the carrier and the polymer layer in a vertical direction, the air gap having a first height in a center and a second height adjacent to the first die, the second height being greater than the first height;
injecting a molding compound around edges of the first die and the second die and into the air gap;
removing the polymer layer; and
forming a redistribution structure over the first die and the second die.

2. The method of claim 1, wherein the removing the polymer layer comprises exposing a concave top surface of the molding compound.

3. The method of claim 1, further comprising forming a dielectric layer over and contacting the molding compound.

4. The method of claim 3, wherein the forming the redistribution structure comprises:
forming a first interconnect structure over the first die and the dielectric layer; and
forming a second interconnect structure over the second die and the dielectric layer.

5. The method of claim 4, wherein:
forming the first interconnect structure comprises forming a first redistribution line extending over a portion of the molding compound between the first die and the second die, wherein a portion of the first interconnect structure interposes the first die and the second die.

6. The method of claim 5, wherein the forming the first redistribution line electrically couples the first die to the second die.

7. The method of claim 4, further comprising forming under bump metallurgy (UBM) structures over the redistribution structure.

8. A method comprising:
pressing a polymer layer over a first die and a second die, the first die comprising a die contact, each of the first die and the second die disposed over a carrier substrate;
injecting a molding compound around the first die and the second die;
removing the polymer layer;
forming a redistribution structure over the first die and the second die, the redistribution structure physically contacting the die contact, the redistribution structure comprising a first interconnect structure over the first die, the first interconnect structure comprising a first contact pad and a second contact pad, the first contact pad directly over the molding compound, the second contact pad directly over the first die; and
forming a first connector over and electrically coupled to the first contact pad and a second connector over and electrically coupled to the second contact pad, a lowermost surface of the first connector being more proximal to the carrier substrate than a lowermost surface of the second connector.

9. The method of claim 8, wherein the pressing the polymer layer comprises forming an air gap between the first die and the second die, the air gap being bounded by a top surface of the carrier substrate, a side surface of the first die, a side surface of the second die, and a convex bottom surface of the polymer layer.

10. The method of claim 8, wherein the forming the first connector and the second connector comprises forming the first connector to have a greater volume than the second connector.

11. The method of claim 8, wherein the forming the first connector and the second connector comprises forming the first connector to have a greater thickness than the second connector.

12. The method of claim 8, further comprising depositing a molded underfill over the redistribution structure and around the first connector and the second connector.

13. The method of claim 12, wherein the depositing the molded underfill around the first connector and the second connector comprises an upper portion of each of the first connector and the second connector remaining free of the molded underfill.

14. The method of claim 12, further comprising after depositing the molded underfill, dicing the molding compound to separate the first die from the second die.

15. The method of claim 8, wherein the forming the redistribution structure comprises forming the first contact pad to be physically contacting the molding compound.

16. A method comprising:
attaching a first die to a carrier substrate, the first die comprising:
a first bond pad;
a second bond pad; and
a first passivation layer disposed over the first bond pad and the second bond pad;
attaching a second die to the carrier substrate;
injecting a molding compound around the first die and the second die, a top of the first die and a top of the second die being free of the molding compound; and
forming a redistribution structure over the first die and the second die, the redistribution structure comprising a first redistribution line extending from the first die to the second die, an entirety of a bottom surface of the first redistribution line physically contacting the molding compound.

17. The method of claim 16, further comprising:
before injecting the molding compound, pressing a polymer layer over the first die and the second die; and
before forming the redistribution structure, removing the polymer layer.

18. The method of claim 16, wherein the forming the redistribution structure further comprises:
forming a plurality of redistribution lines;
forming a first contact pad directly over the molding compound; and
forming a second contact pad directly over the first die.

19. The method of claim 18, further comprising forming a first connector over and electrically coupled to the first contact pad, the first connector being electrically coupled to the first bond pad.

20. The method of claim 19, further comprising forming a second connector over and electrically coupled to the second contact pad, the first connector having a greater volume than the second connector.

* * * * *